(12) United States Patent
Tashiro

(10) Patent No.: US 9,433,087 B2
(45) Date of Patent: Aug. 30, 2016

(54) DISPLAY DEVICE

(71) Applicant: MITSUBISHI ELECTRIC CORPORATION, Tokyo (JP)

(72) Inventor: Tomohiro Tashiro, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 140 days.

(21) Appl. No.: 14/482,177

(22) Filed: Sep. 10, 2014

(65) Prior Publication Data

US 2015/0077950 A1    Mar. 19, 2015

(30) Foreign Application Priority Data

Sep. 19, 2013    (JP) .................................. 2013-194317

(51) Int. Cl.

| | | |
|---|---|---|
| H05K 1/00 | (2006.01) | |
| H05K 1/02 | (2006.01) | |
| H05K 1/03 | (2006.01) | |
| H05K 5/00 | (2006.01) | |
| G02F 1/1345 | (2006.01) | |
| H05K 3/32 | (2006.01) | |
| G02F 1/1333 | (2006.01) | |
| H05K 3/36 | (2006.01) | |

(52) U.S. Cl.
CPC ......... *H05K 1/0281* (2013.01); *G02F 1/13452* (2013.01); *H05K 1/0306* (2013.01); *H05K 3/323* (2013.01); *H05K 5/0017* (2013.01); *G02F 2001/133302* (2013.01); *H05K 1/0271* (2013.01); *H05K 3/361* (2013.01); *H05K 2201/068* (2013.01); *H05K 2201/09154* (2013.01)

(58) Field of Classification Search
CPC ............... G02F 1/13452; G02F 2001/133302; H05K 1/0271; H05K 1/0281; H05K 1/0306; H05K 2201/068; H05K 2201/09154; H05K 3/323; H05K 3/361; H05K 5/0017
USPC ......... 361/749, 760, 764; 174/254, 260, 259
See application file for complete search history.

(56) References Cited

U.S. PATENT DOCUMENTS

| | | | |
|---|---|---|---|
| 2007/0177092 A1* | 8/2007 | Hosoya ................. | G02F 1/1345 349/149 |
| 2008/0088765 A1* | 4/2008 | Hashimoto ........... | G02F 1/1333 349/58 |
| 2011/0050657 A1* | 3/2011 | Yamada .............. | H01L 27/3293 345/204 |
| 2013/0335684 A1* | 12/2013 | Yoshikawa ........... | G02F 1/1333 349/96 |
| 2015/0028316 A1* | 1/2015 | Kojima ............... | H01L 51/5212 257/40 |

FOREIGN PATENT DOCUMENTS

| | | |
|---|---|---|
| JP | 2005-311106 A | 11/2005 |
| JP | 2007-281378 A | 10/2007 |
| JP | 2011-009270 A | 1/2011 |

\* cited by examiner

*Primary Examiner* — Yuriy Semenenko
(74) *Attorney, Agent, or Firm* — Studebaker & Brackett PC

(57) ABSTRACT

A display device includes: a glass substrate including a driver circuit and a plurality of connection terminals that is connected to the driver circuit and is arranged in an array, and an elongated FPC, which has a plurality of panel connection terminals that correspond to the connection terminals and which is mounted on the glass substrate, wherein the FPC has a coverlay. The FPC has a chamfered-area end gap between an end portion of the coverlay facing an end face of the glass substrate and a chamfered-area end portion of the glass substrate in a mounted state, wherein the chamfered-area end gap is covered with an insulating resin, and wherein the chamfered-area end gap at a center portion of the FPC is narrower than the chamfered-area end gap at both end portions of the FPC.

4 Claims, 6 Drawing Sheets

FIG.6   -BACKGROUND ART-
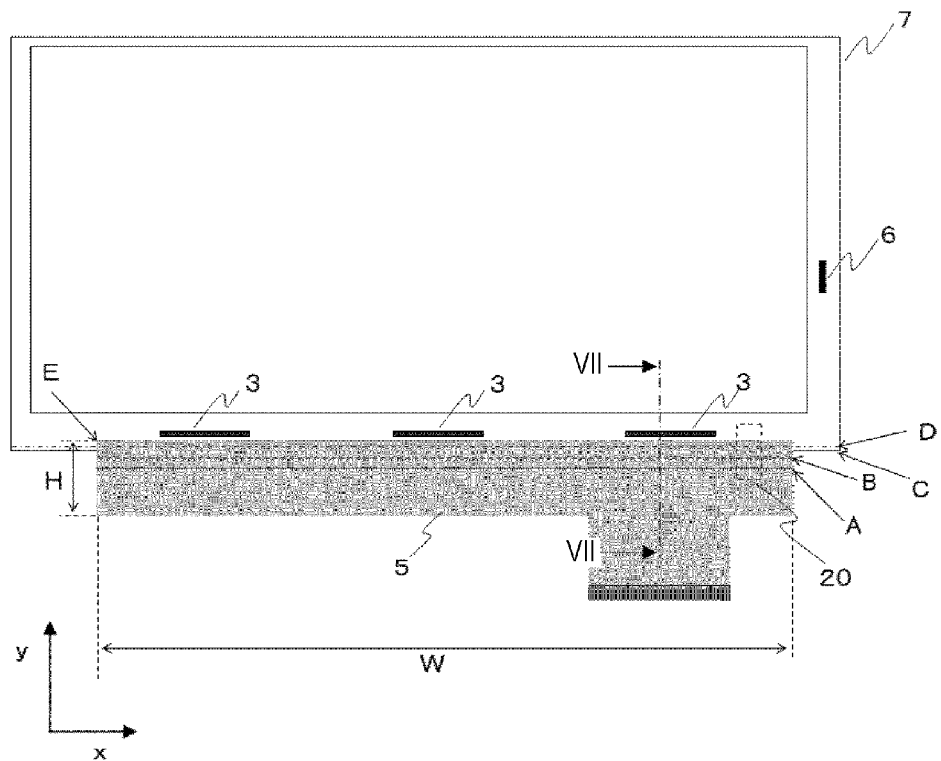
FIG.7   -BACKGROUND ART-
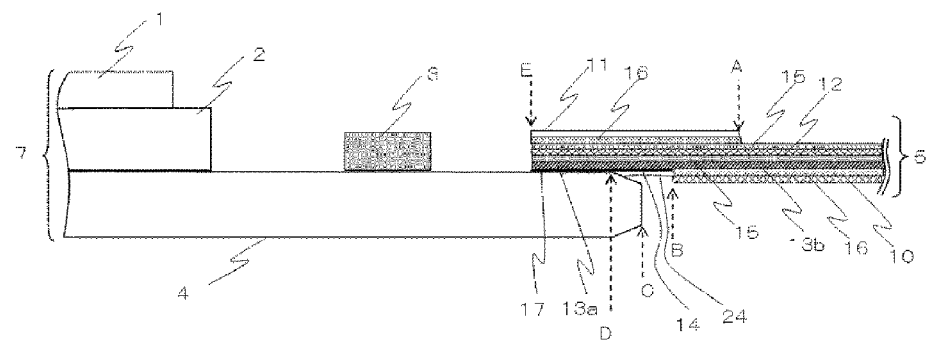

DISPLAY DEVICE

CROSS-REFERENCE TO RELATED APPLICATION

This application claims priority from Japanese Patent Application No. 2013-194317 filed on Sep. 19, 2013, the entire subject matter of which is incorporated herein by reference.

TECHNICAL FIELD

This disclosure relates to a display device having a flexible wiring substrate mounted on an end portion of a glass substrate. Specifically, this disclosure can be used for a liquid crystal display device, an organic EL display device and the like.

BACKGROUND

As shown in FIG. 6, in a liquid crystal display device using a COG (Chip On Glass) technology, a long flexible wiring substrate 5 (hereinafter, referred to as the FPC: Flexible Printed Circuit) extending in an x direction is connected to a liquid crystal panel 7 in many cases. In this case, a terminal-exposed part is made in a gap between a front-face coverlay end portion B (an end portion facing an end face of a glass substrate) of the FPC 5 and a chamfered area end portion D of the glass substrate of the liquid crystal panel 7 (refer to FIG. 1 of JP-A-2007-281378). Additionally, the symbol A is rear-face coverlay end portion located on a rear side, and the symbol E is an end portion of FPC located on a glass substrate side. In order to suppress corrosion of the exposed terminal (a plated part), a resin 24 is applied to the terminal-exposed part (refer to FIG. 5 of JP-A-2007-281378).

Meanwhile, in below descriptions, a "front-face" of the FPC 5 refers to a face on which a connection terminal (a conductor for wiring) 13a with the liquid crystal panel 7 is provided, and a "rear-face" refers to a face on which a coverlay 11 is provided.

As shown in FIG. 7, which is a sectional view as seen in a VII direction of FIG. 6, the three-layered FPC 5 of the background art has a layer configuration where coverlay adhesive layers 16 are provided between a front-face coverlay 10 and the panel connection terminal (a conductor for wiring) 13a and between the rear-face coverlay 11 and a base film 12 and base film adhesive layers 15 are provided on both faces of the base film 12 (refer to a paragraph [0050] of JP-A-2011-9270). Additionally, the liquid crystal panel 7 include a polarizing plate 1, and a color filter, and a glass substrate 4.

For a two-layered FPC in which an adhesive is not used, the base film adhesive layers 15 are not provided (refer to a paragraph [0027] of JP-A-2011-9270).

Here, a linear expansion coefficient of the glass, which is one substrate material of the liquid crystal panel 7 shown in FIG. 7, is about 4 ppm/K, general polyimide, which is used as the base film 12 and coverlays 10, 11 of the FPC 5, has a linear expansion coefficient of about 16 to 18 ppm/K, and the coverlay adhesive 16 or base film adhesive 15 adhering the base film and coverlays has a linear expansion coefficient of about 100 ppm/K, which is considerably larger than other linear expansion coefficients. As a result, in a case where FPC 5 is repeatedly shrank and expanded in a thermal shock test repeating low and high temperatures, the FPC 5 fixed to the glass substrate 4 is easily applied with stress at both ends in a W direction (a longitudinal direction of the FPC) of FIG. 6.

SUMMARY

In order to relieve the stress, a variety of methods are adopted. For example, (1) a two-layered material having no base film adhesive layer 15 of FIG. 7 may be adopted, (2) the gap between B and C of FIG. 7 may be made to have a wave shape (refer to FIG. 2 of JP-A-2005-311106) and (3) the rear-face coverlay 11 of FIG. 7 may be omitted.

However, the two-layered material of the method (1) is more expensive than the three-layered material. When the gap between B and C of FIG. 7 is made to have a wave shape in the method (2), it is necessary to secure a large overlap amount between E and D of FIG. 7, which is disadvantageous to a narrow frame design. According to the method (3) of omitting the rear-face coverlay 11, when the FPC, which has been once bent towards a rear-face of a backlight unit, is returned to an original planar state upon replacement of the backlight unit for a display device, for example, the stress is applied to the panel connection terminal 13a between E and D of FIG. 7, so that a risk of disconnection is increased. Therefore, it is difficult to reuse the liquid crystal panel adopting the FPC.

In the meantime, FIGS. 8A and 8B are enlarged schematic views of a selected part 20 of a connection area shown with the dashed-dotted line in FIG. 6. In the example of FIG. 8B, the distance between B and D is increased without changing a position of an end portion A of the rear-face coverlay 11, as compared to the example of FIG. 8A. According to an expansion and shrinkage amount Δ (which is shown with Δ1 and Δ2 in FIG. 8) of the FPC 5 due to a temperature change, since the distance between B and D is increased, Δ1 is larger than Δ2. Therefore, the area of the front-face coverlay 10 of the FPC 5 is narrowed and thus the adhesive layer area is decreased.

Meanwhile, regarding an angle θ of bend of the panel connection terminal 13a due to the temperature change, as comparing an bend angle θ2 in a case where the distance between B and D is long and an bend angle θ1 in a case where the distance between B and D is short, θ1 is larger than θ2. Therefore, the stress applied to the panel connection terminal 13a of the end portion of the front-face coverlay 10 of the end portion B has the same relation (in the specification, Δ is used instead of the Greek delta.).

Meanwhile, as shown with a reference symbol 14 in FIG. 7, the end portion B of the front-face coverlay 10 is an end portion of a Ni—Au plated part, which is generally frequently used as the front-face treatment, and the stress is like to be concentrated thereto. In particular, when the length W of the FPC 5 (FIG. 6) is lengthened, the stress concentration is increased and the disconnection is caused in some cases.

However, when the distance between B and D is set to be too long, an amount of the insulating resin 24 applied for suppressing corrosion (refer to FIG. 5 of JP-A-2007-281378) is increased, or the applying of the resin becomes impossible (due to the wettablility of the resin), which is contradictory to the stress relief.

A display device of one aspect of this disclosure includes: a glass substrate including a driver circuit and a plurality of connection terminals that is connected to the driver circuit and is arranged in an array, and an elongated FPC, which has a plurality of panel connection terminals that correspond to the connection terminals and which is mounted on the glass substrate. The FPC has a base film, a base-film-adhering material, a coverlay and a conductor for wiring. The FPC has a chamfered-area end gap between an end portion of the coverlay facing an end face of the glass substrate and a chamfered-area end portion of the glass substrate in a mounted state. The chamfered-area end gap is covered with an insulating resin. The chamfered-area end gap at a center portion of the FPC is narrower than the chamfered-area end gap at both end portions of the FPC.

According to this disclosure, even when a state occurs where it is necessary to widen a gap between a glass end and a coverlay end portion of the FPC to relieve the stress at both end portions of the elongated FPC, the resistance characteristics against the disconnection of the FPC is improved without increasing an amount of a resin.

BRIEF DESCRIPTION OF THE DRAWINGS

The foregoing and additional features and characteristics of this disclosure will become more apparent from the following detailed descriptions considered with the reference to the accompanying drawings, wherein:

FIG. 6 is a plan view illustrating configurations of a liquid crystal panel and an FPC of a display device of the background art;

FIG. 7 is a sectional view illustrating the configurations of the liquid crystal panel and the FPC of the display device of the background art.

DETAILED DESCRIPTION

Hereinafter, illustrative embodiments of this disclosure will be described with reference to the drawings. Meanwhile, in the respective drawings, the elements having the same or equivalent functions are denoted with the same reference symbols to avoid the overlapping and redundant descriptions.

First Illustrative Embodiment

Figure 1:
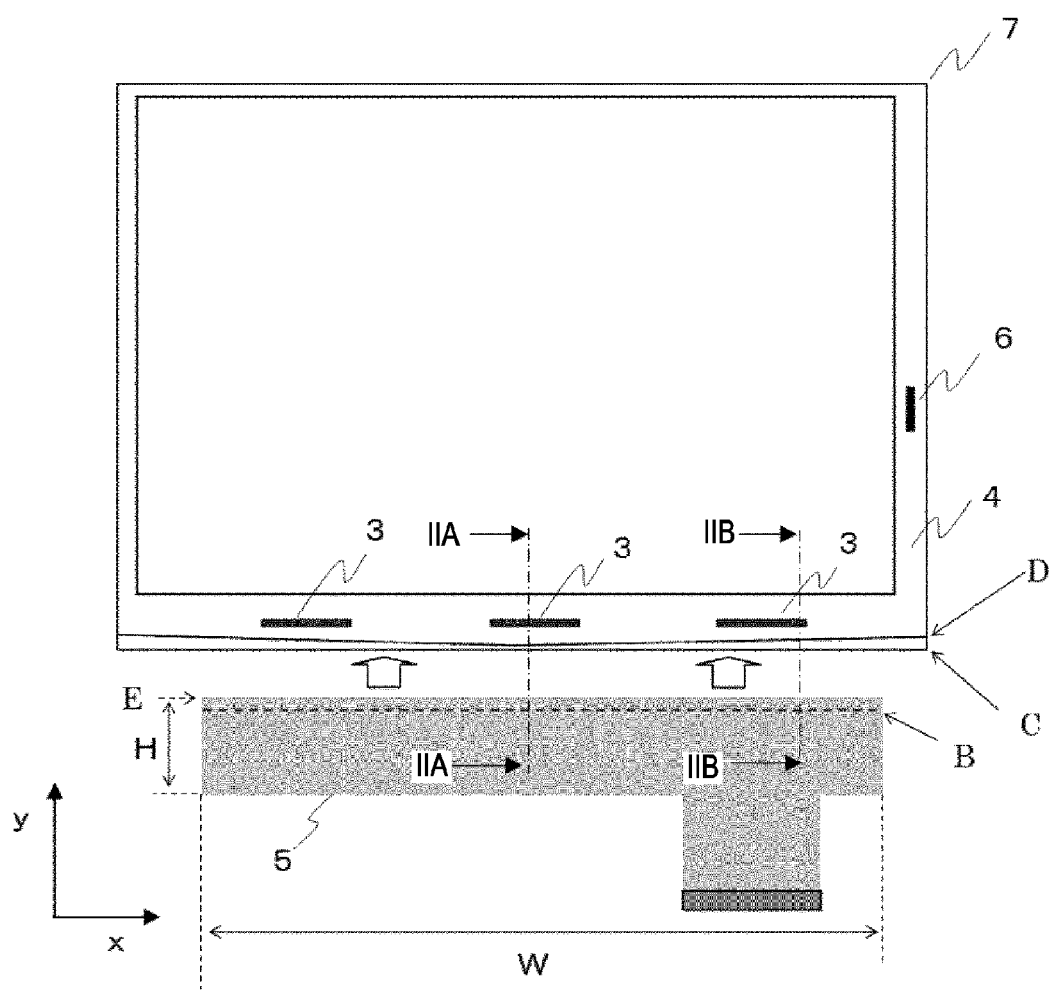
FIG. 1 is a configuration view illustrating a mounting state of an FPC on a liquid crystal panel of a display device according to a first illustrative embodiment of this disclosure.
Figure 2A:
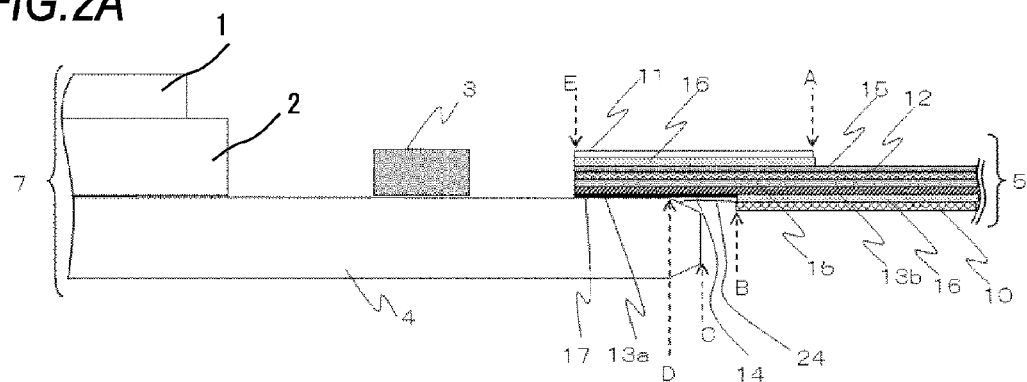
FIGS. 2A and 2B are sectional views illustrating a mounted state of the FPC on the liquid crystal panel of the display device according to the first illustrative embodiment of this disclosure.
Figure 2B:
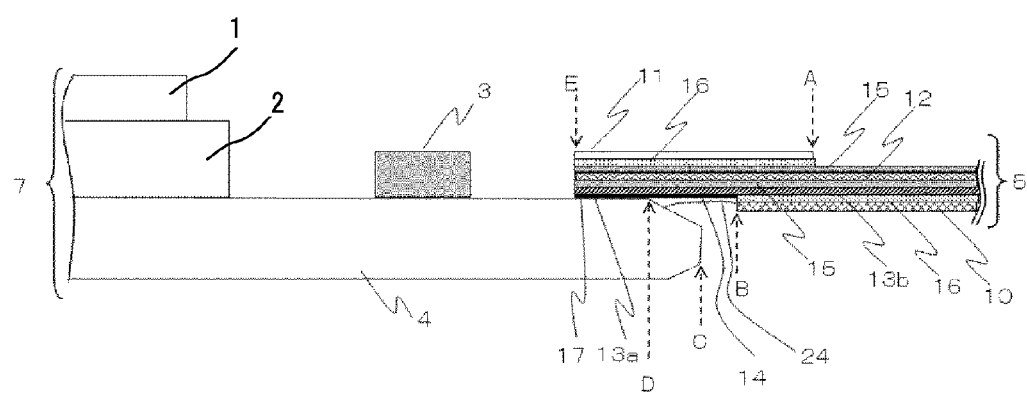

FIG. 1 is a configuration view illustrating a mounting state of an FPC on a liquid crystal panel of a liquid crystal display device according to a first illustrative embodiment of this disclosure, and illustrates a configuration before the FPC is attached, to easily see a chamfered pattern of an end portion of a glass substrate 4 of a liquid crystal panel 7. FIGS. 2A and 2B are sectional views illustrating a state where the FPC is attached, when the FPC 5 is mounted (with overlapping to have a predetermined width in a y direction shown with the arrow) at a predetermined position on the liquid crystal panel 7 shown in FIG. 1 and a liquid crystal display device is thus assembled. FIG. 2A is a sectional view as seen in an IIA direction at a position shown with the central dashed-dotted line of FIG. 1, and FIG. 2B is a sectional view as seen in an IIB direction at a position shown with the right dashed-dotted line of FIG. 1.

Here, as denoted in FIG. 1, the y direction indicates a direction of a height H of the elongated FPC 5 (the reference symbol H indicates a size in a short side direction of the FPC 5). Lead wirings (not shown) from a source driver IC 3 and a gate driver IC 6 in the glass substrate 4 are wired to corresponding connection terminals 17 at the glass substrate-side. The connection terminals 17 are connected to a plurality of panel connection terminals 13a arranged to align in correspondence the connection terminals 17 in a longitudinal direction of the FPC 5, by ACF (Anisotropic Conductive Film) connection. The plurality of panel connection terminals 13a is connected to wiring conductors 13b corresponding to the lead wirings, in the FPC 5.

In FIG. 1, the arranging direction of the plurality of panel connection terminals 13a is denoted as the x direction, and the direction is the same as a width direction of the longitudinal direction of the FPC 5. Also, a reference symbol W of FIG. 1 indicates a size of the FPC 5 in the longitudinal direction. Here, an ACF is a general technology of connecting the glass substrate and the panel connection terminals of the FPC 5.

As shown in FIG. 1, the glass substrate 4 is chamfered so that a chamfered amount thereof is gradually increased from a center portion toward end portions. As a result, a gap (hereinafter, also referred to as a B-D interval) between a chamfering starting point (a chamfered area end portion) D of the glass substrate 4 and an end portion B (a terminal facing an end face of the glass substrate) of a front-face coverlay 10 of the FPC 5 is configured so that a distance the gap becomes the shortest at the center portion and becomes long at the both end portions in right and left positions. That is, as can be clearly seen from FIGS. 2A and 2B, the B-D interval can be made to be large at both end-sides of the FPC 5. Here, a connection area between the FPC 5 and the glass substrate 4 is an overlapping area (D-E interval) between the chamfering starting point (the chamfered area end portion) D of the glass substrate 4 and an end portion (a glass substrate-side) E of the FPC 5. That is, the chamfering starting point D corresponds to an end portion of the glass substrate-side of the connection area between the FPC 5 and the glass substrate 4.

Here, as a method of increasing the chamfered amount of both end-sides of the glass substrate 4, if a grinding roller used for chamfering for a grinding process is slightly inclined at the left and right ends of the glass substrate 4, the grinding process can be easily performed.

According to the liquid crystal display device of this disclosure, since the FPC 5, which is easy to be extended, is fixed to the glass substrate 4, which is difficult to be extended, by the ACF, an expansion and shrinkage amount Δ of the FPC 5 due to a temperature change at the center side is considerably smaller than amounts Δ at both end-sides even though the width W of the FPC 5 in the longitudinal direction is remarkably large. As a result, the part for which it is necessary to keep the B-D interval to be long similarly to the liquid crystal display device of the background art is just the vicinities of both end-sides of the FPC 5. That is, even when the distance of the B-D interval at the center-side of the FPC 5 is shorter than the distance of the B-D interval at both end-sides, there is no problem. Therefore, it is not necessarily to make the distance of the B-D interval uniform in the x direction, similarly to the FPC 5 of the background art shown in FIG. 6.

Figure 3:
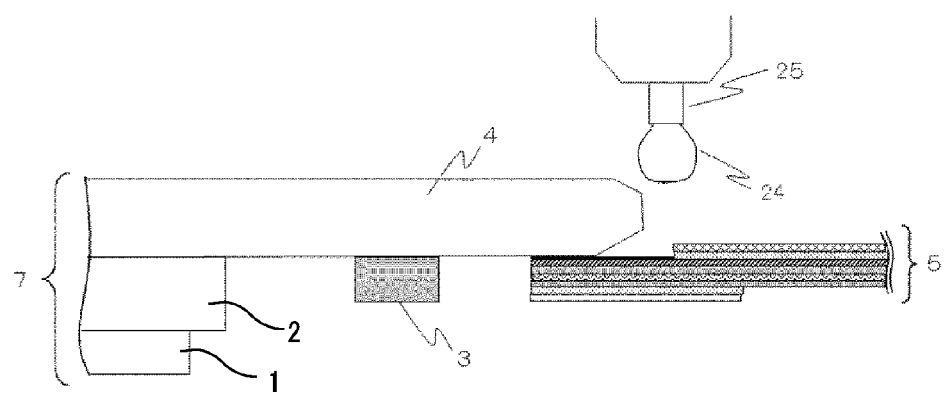
FIG. 3 is a schematic view illustrating a process where an insulating resin is applied to a gap (a plate part) between a chamfered area end portion of a glass substrate and a terminal of a front-face coverlay of the FPC.

Subsequently, a process of applying an insulating resin 24 after mounting the FPC 5 on the liquid crystal panel 7 is described with reference to FIG. 3. In FIG. 3, a reference symbol 24 indicates the insulation resin that is applied between the B-D, and a reference symbol 25 indicates a dispenser for applying the insulating resin 24. In the process of applying the insulating resin 24, the liquid crystal panel 7 is set so that a display face thereof faces downwards, and the dispenser 25 is scanned in the x direction from one end of the glass substrate 4 towards the other end while applying a predetermined amount of the insulating resin 24 so as to fill between the B-D.

Alternatively, a configuration where the dispenser 25 is fixed and the liquid crystal panel 7 is moved to apply the resin 24 is also possible. In this case, a discharge amount of the resin 24 from the dispenser 25 is made to be slightly larger in the vicinities upon the applying starting and ending portions, as compared to the center portion. Thereby, it is easy to secure the same applying amount as the liquid crystal display device of the background art. In the meantime, during the applying, the insulating resin 24 used at the center-side of the FPC 5 is reduced. For example, the dispenser 25 and the liquid crystal panel 7 are set so that the resin 24 is applied from the left end or right end of the FPC 5, and then the dispenser 25 or liquid crystal panel 7 is moved towards the opposite end portion-side. Thereby, the insulating resin 24 applied at the center portion of the FPC 5 is reduced, as compared to the liquid crystal display device of the background art, and the insulating resin 24 applied at both end-sides of the FPC 5 in the substantially is the same amounts as the background art.

As described above, when the distance between the coverlay end portion B and the chamfered area end portion D is shortened at the center portion of the FPC, since the distance of the B-D interval becomes short as shown in FIG. 2A, it is possible to cover whole of the plated part 14 with a relatively small applying amount of the resin.

Meanwhile, as described above, the insulating resin 24 is applied along the x direction to fill between the B-D. Therefore, the dispenser 25 for applying the insulating resin 24 may be temporarily stopped upon the starting and ending of the applying, so that it is possible to control the applying amount more easily. Therefore, even when the distance of the B-D interval is lengthened at both end-sides of the FPC 5, it is possible to prevent a case where the gap between the B-D is not sufficiently filled with the resin 24 and the covering of the plated part 14 becomes insufficient. That is, it is capable of increasing the amount of the insulating resin 24 only at both end-sides of the FPC 5.

As described above, according to the first illustrative embodiment, the glass substrate 4 is slightly chamfered in the vicinity of the center portion thereof. Therefore, the distance between the B-D interval is shortened, so that and the usage amount of the insulating resin 24 is reduced. As another method, it may be adopted that an end-face C of the glass substrate 4 in the vicinity of the center portion is slightly grinded so that the distance between the B-C in the vicinity of the center portion of the glass substrate 4 is reduced (the distance between the chamfered parts D and C is not changed). Even in this method, it is also possible to reduce the usage amount of the insulating resin 24.

Second Illustrative Embodiment

Figure 4:
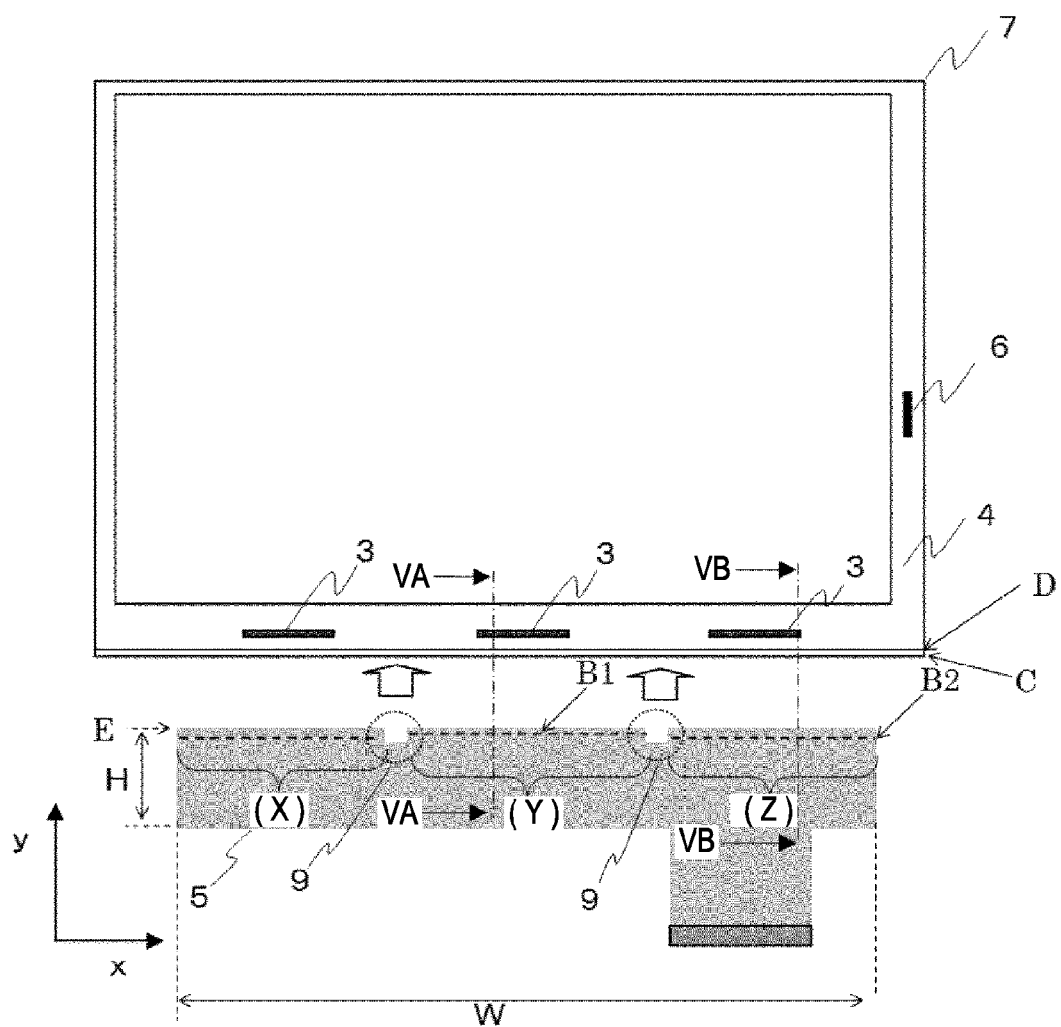
FIG. 4 is a configuration view illustrating a mounting state of an FPC on a liquid crystal panel of a display device according to a second illustrative embodiment of this disclosure.

FIG. 4 is a configuration view illustrating a mounting state of an FPC on a liquid crystal panel of a display device according to a second illustrative embodiment of this disclosure, and it shows a configuration before the FPC is attached to easily see a positional relation between an end portion B1 or B2 of the coverlay 10 of the FPC 5 and the end-face C of the glass substrate 4. FIG. 5 is a sectional view illustrating a mounted state of the FPC on the liquid crystal panel when the FPC 5 is mounted (with overlapping to have a predetermined width in the y direction shown with the arrow) at a predetermined position on the liquid crystal panel 7 shown in FIG. 4 and a liquid crystal display device is thus assembled.

Figure 5A:
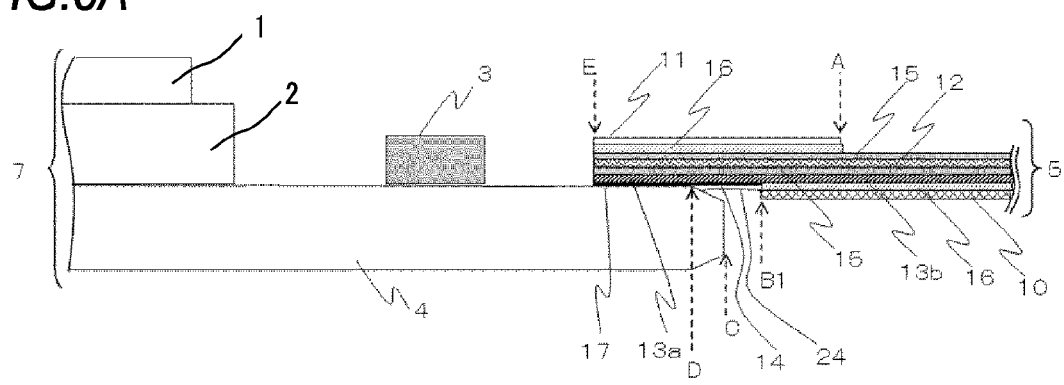
FIGS. 5A and 5B are sectional views illustrating a mounted state of the FPC on the liquid crystal panel of the display device according to the second illustrative embodiment of this disclosure.
Figure 5B:
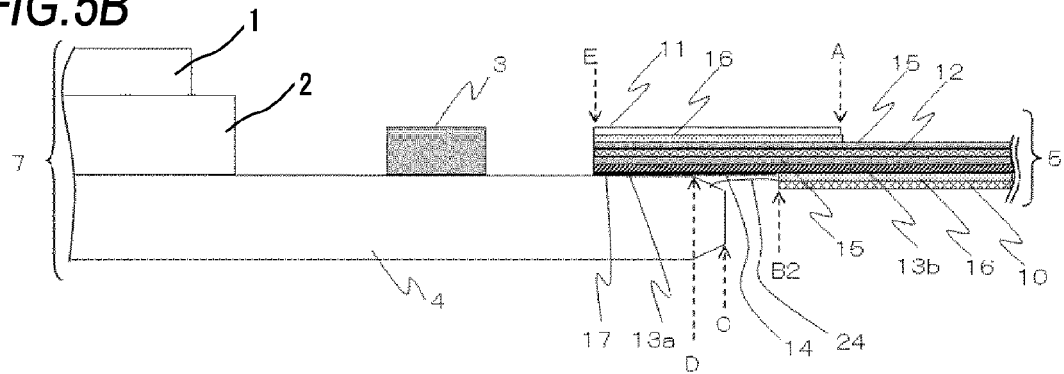
Figure 8A:
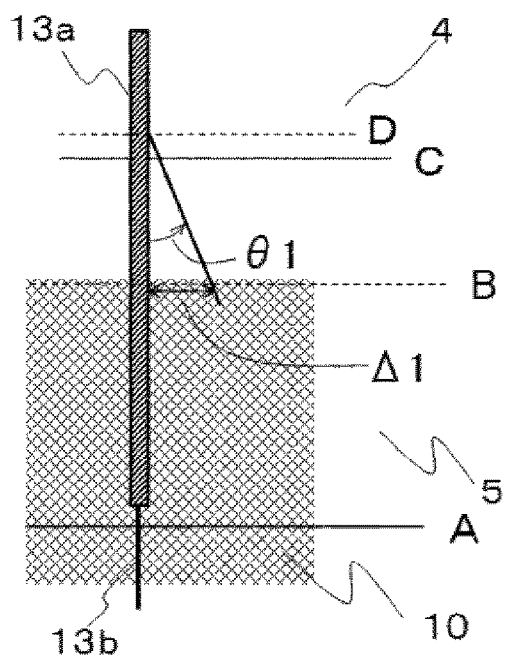
FIGS. 8A and 8B are schematic views illustrating a change amount due to a temperature change applied to a terminal in the display device of the background art.
Figure 8B:
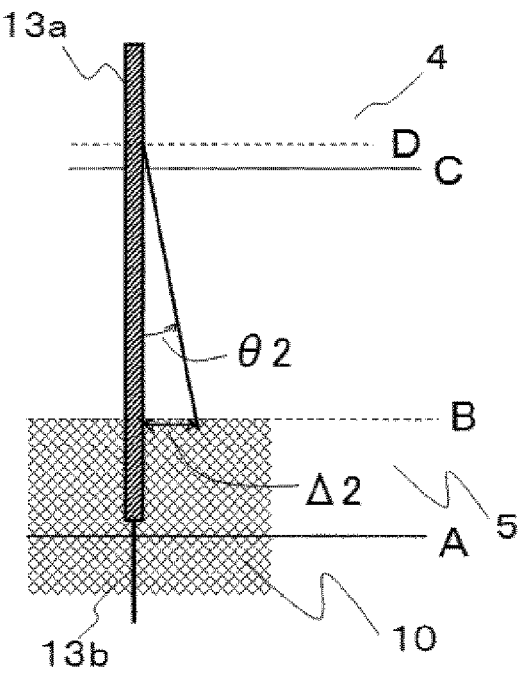

Here, FIG. 5A is a sectional view as seen in an VA direction at a position shown with the central dashed-dotted line of FIG. 4, and FIG. 5B is a sectional view as seen in an VB direction at a position shown with the right dashed-dotted line of FIG. 4.

In the second illustrative embodiment, as denoted with (X), (Y) and (Z) in FIG. 4, the ACF end portion of the FPC 5 is divided into three blocks in the longitudinal direction (x direction). As can be clearly seen from FIGS. 5A and 5B, a gap between the end-face C of the glass substrate 4 and the end portion B1 or B2 of the coverlay 10 (hereinafter, referred to as the B1-C interval or B2-C interval) at both end blocks (X) and (Z) is made to be longer than the gap at the central block (Y). That is, as comparing positional relations between the end portions B1, B2 of the coverlay 10 and the end-face C of the glass substrate 4 shown in FIGS. 4, 5A and 5B, the end portions B1, B2 of the front-face coverlay 10 are arranged so that a relation where B2-C interval is longer than B1-C interval is satisfied. Here, as can be clearly seen from FIGS. 4, 5A and 5B, the chamfered position (chamfered area end portion) D of the glass substrate 4 is uniform in the x direction, unlike the first illustrative embodiment. Therefore, a relation where B2-D interval is longer than B1-D interval is also satisfied.

Further, as can be clearly seen from FIG. 4, the FPC 5 has slits 9 between the block (X) and the block (Y) and between the block (Y) and the block (Z). When applying the insulating resin 24 shown in FIG. 3 between the FPC 5 and the glass substrate 4, it is possible to temporarily stop the applying at the slits 9 and to easily change the applying conditions.

Regarding the applying conditions, it is possible to easily change the applying amount of the insulating resin 24 for each slit and to change the position of the dispenser 25 in the y direction shown in FIG. 3 for changing the center coordinates when applying the resin 24. Further, in an example case where a recognition mark is provided in the vicinity of the slit 9 and is recognized by a camera and the like, it is possible to easily control the dispenser 25 to change the resin amount or y position. Similarly to the first illustrative embodiment, regarding the gap between the end-face C of the glass substrate 4 and the end portion of the coverlay 10, the B1-C interval of the central part can be made to be shorter, as compared to the B2-C interval of both end-sides. Also, the insulating resin 24 applied at the central part of the FPC 5 is reduced, as compared to the liquid crystal display device of the background art, and the insulating resin 24 is easily applied at both end-sides of the FPC 5 in the same amount as the background art. As a result, it is possible to reduce the usage amount of the insulating resin 24.

Meanwhile, in the second illustrative embodiment, the ACF end portion of the FPC is divided into the three blocks of (X), (Y) and (Z). The number of the divisions is not necessarily three. That is, when the ACF end portion is divided into three or more blocks and when the B-C interval in both end blocks in the longitudinal direction of the FPC is longer than the B-C interval of the other blocks, it is possible to realize the same effects of this illustrative embodiment.

Meanwhile, if one side of the FPC is slightly deviated in the y direction and then mounted on the liquid crystal panel by the ACF, the FPC is mounted at a state where the B-C interval at one end portion of the FPC becomes short and the B-C interval at the other end portion of the FPC becomes long. In view of the above, if each B-C interval is appropriately set so that the B-C interval at both end portions is longer than the B-C interval at the center-side with assuming the maximum deviation amount caused in the manufacturing, the effects of this disclosure described in the first and second illustrative embodiments can be obtained.

Further, in the first and second illustrative embodiments, this disclosure has been described with reference to the example where the FPC is mounted on the end portion of the glass substrate of the liquid crystal panel. However, the substrate to which the FPC is connected is not necessarily the liquid crystal panel. For example, a glass substrate of an organic EL display panel and a glass substrate of a plasma display are also possible.

What is claimed is:

1. A display device comprising:
   a glass substrate including a driver circuit and a plurality of connection terminals that is connected to the driver circuit and is arranged in an array, and
   an elongated Flexible Printed Circuit (FPC), which has a plurality of panel connection terminals that correspond to the connection terminals and which is mounted on the glass substrate,
   wherein the FPC has a base film, a base-film-adhering material, a coverlay and a conductor for wiring,
   wherein the FPC has a chamfered-area end gap between an end portion of the coverlay facing an end face of the glass substrate and a chamfered-area end portion of the glass substrate in a mounted state,
   wherein the chamfered-area end gap is covered with an insulating resin, and
   wherein the chamfered-area end gap at a center portion of the FPC is narrower than the chamfered-area end gap at both end portions of the FPC.

2. The display device according to claim 1,
   wherein four sides in the end face of the glass substrate is chamfered, and
   wherein the plurality of the connection terminals is provided at one side of the four sides in the end face of the glass substrate,
   wherein a chamfered amount at the center portion of the one side is smaller than the chamfered amount at the both end portions of the one side.

3. The display device according to claim 1,
   wherein the FPC has an end-face gap between the end portion of the coverlay facing the end face of the glass substrate and the end face of the glass substrate in a mounted state, and
   wherein the end-face gap at the center portion of the FPC is narrower than the end-face gap at both end portions of the FPC.

4. The display device according to claim 1,
   wherein the plurality of panel connection terminals of the FPC is divided into three or more blocks, and
   wherein among the plurality of blocks, the gap corresponding to the panel connection terminal arranged in an outer block in a terminal array direction of the FPC is wider than the gap corresponding to the panel connection terminals arranged in the other blocks provided on a center side.

* * * * *